United States Patent [19]

Myer

[11] Patent Number: 4,580,105
[45] Date of Patent: Apr. 1, 1986

[54] AUTOMATIC REDUCTION OF INTERMODULATION PRODUCTS IN HIGH POWER LINEAR AMPLIFIERS

[75] Inventor: Robert E. Myer, Denville, N.J.

[73] Assignee: AT&T Bell Laboratories, Murray Hill, N.J.

[21] Appl. No.: 695,050

[22] Filed: Jan. 25, 1985

[51] Int. Cl.[4] ............................................. H03F 1/26
[52] U.S. Cl. ...................................... 330/149; 330/52
[58] Field of Search ......................... 330/52, 149, 151

[56] References Cited

U.S. PATENT DOCUMENTS

| 3,675,138 | 7/1972 | Standing | 330/149 |
| 3,886,470 | 5/1975 | O'Neil et al. | 330/149 |
| 3,922,617 | 11/1975 | Denniston et al. | 330/151 |
| 4,276,514 | 6/1981 | Huang | 330/149 |
| 4,291,277 | 9/1981 | Davis et al. | 330/149 |
| 4,414,686 | 11/1983 | Lenz | 455/220 |

OTHER PUBLICATIONS

"Adaptive Linearization of Power Amplifiers in Digital Radio Systems", By A. A. M. Saleh et al., Bell System Technical Journal, vol. 62, No. 4, Apr. 1983, pp. 1019-1033.

"Correction of Non-Linearity in Low and Medium Power Transmitters and Transposers" by C. Cluniat, Review Technique Thomson-CSF, vol. 10, No. 2, Jun. 1978, pp. 1-46.

Primary Examiner—James B. Mullins
Assistant Examiner—G. Wan
Attorney, Agent, or Firm—Charles Scott Phelan; Robert O. Nimtz; Patrick E. Roberts

[57] ABSTRACT

A distortion simulating pilot is injected at the input of an amplifier which uses feed forward distortion correction. The magnitude of the pilot signal in the amplifier output is used to control a decreasing step size circuit algorithm for adjusting the gain and phase of the feed forward distortion signal to eliminate substantially the pilot signal and the distortion introduced by the amplifier.

8 Claims, 6 Drawing Figures

AUTOMATIC CONTROL

AUTOMATIC CONTROL

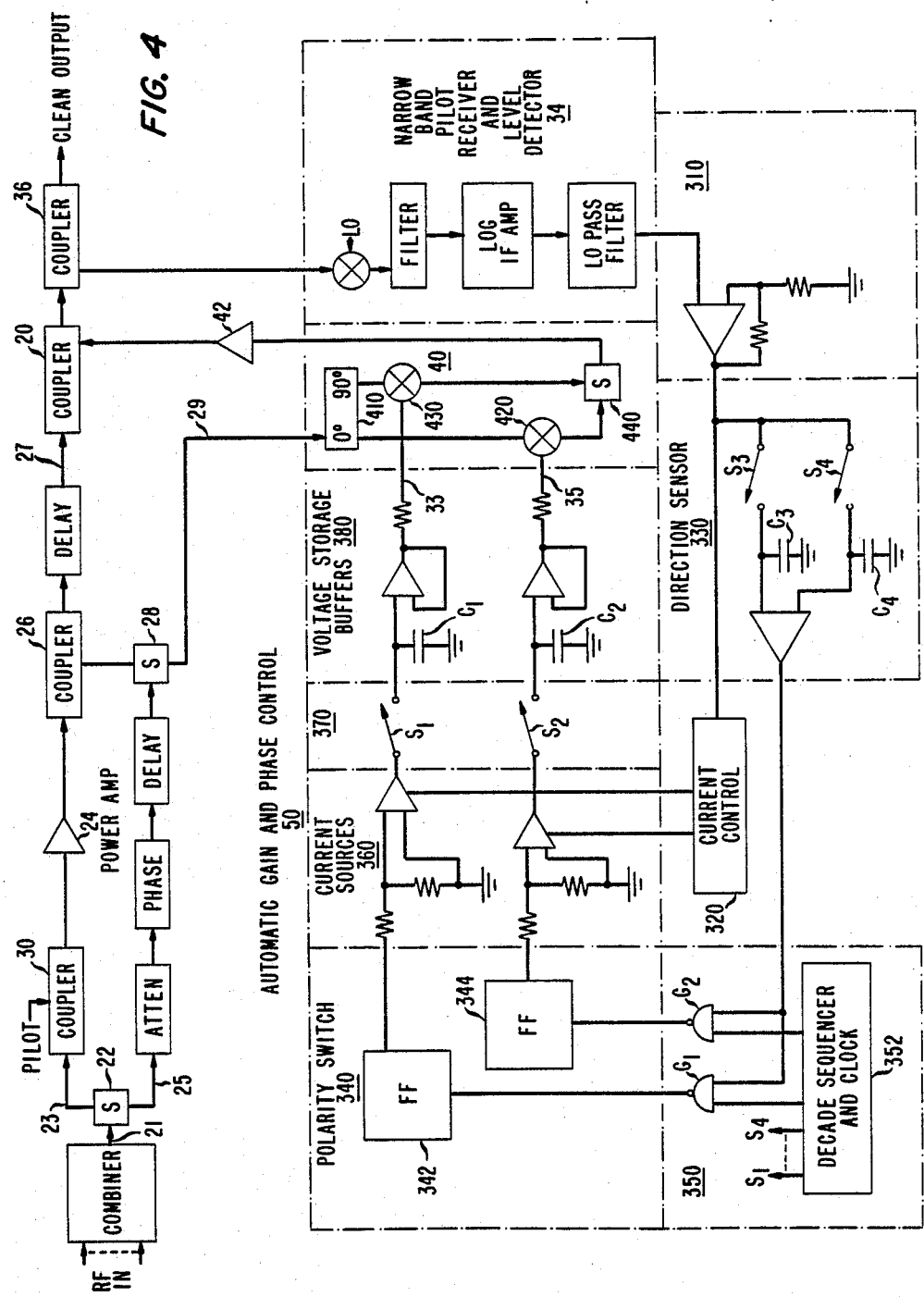

AUTOMATIC CONTROL CIRCUIT

AUTOMATIC REDUCTION OF INTERMODULATION PRODUCTS IN HIGH POWER LINEAR AMPLIFIERS

TECHNICAL FIELD

This invention relates to high power linear amplifiers and, in particular, to an automatic control system using a pilot tone for the reduction of distortion produced by high power linear amplifiers.

BACKGROUND OF THE INVENTION

All linear amplifiers distort the signal at some power level. This distortion produces intermodulation products when multiple signals are present. Intermodulation products are undesirable because they cause interference and crosstalk. Standards have been set to limit the level of these unwanted signals in transmitters. To meet these standards, methods of reducing distortion have been developed.

The most common method is called feedback. Feedback works well at low frequencies but it becomes a problem at ultra high frequencies. At these frequencies two basic methods are generally used. They are predistortion and feed forward.

Predistortion involves producing a distortion similar to the distortion being generated by the linear amplifier and adding it at the input in the correct gain, phase and delay to produce cancellation of the distortion at the output of the linear amplifier. This method requires matching the distortion characteristics of two amplifiers and hence limits the amount of correction that can be obtained.

The feed forward method does not have this limitation because it separates out the distortion generated in the linear amplifier itself, and then adds it back with gain, phase, and delay adjusted for maximum cancellation. The amount of distortion reduction available using feed forward is limited by the accuracy of the gain and phase adjustments. Continuous precision trimming of these adjustments is necessary to achieve and maintain the maximum distortion reduction.

SUMMARY OF THE INVENTION

A distortion simulating pilot is injected at the input of an amplifier which uses feed forward distortion correction. The magnitude of the pilot signal in the amplifier output is used to control a decreasing step size circuit algorithm for adjusting the amplitude and phase of the feed forward distortion signal to eliminate substantially the pilot signal and the distortion introduced by the amplifier.

A search limiter circuit is provided to prevent the circuit from locking up if the pilot signal is temporarily lost.

A course control circuit is included for taking a large step size when the system is first turned on.

The present invention provides 360 degrees phase adjustment and up to about twenty decibels of gain adjustment.

BRIEF DESCRIPTION OF THE DRAWINGS

FIGS. 3, 4 and 6 show the control circuit of FIG. 2 in various levels of detail.

DETAILED DESCRIPTION

Figure 1:
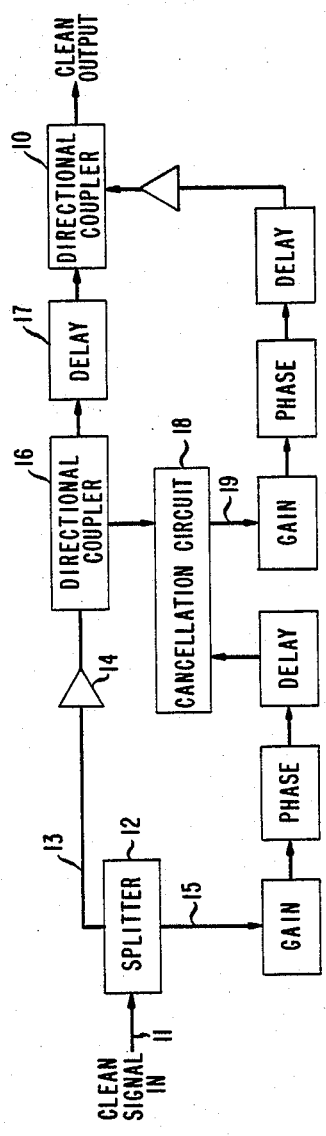
FIG. 1 shows the prior art.

Referring to FIG. 1, there is shown a prior art circuit in block diagram form of a feed forward system. Splitter circuit 12 causes the input signal on lead 11 to be duplicated: one part is sent to power amplifier 14 and the other to canceler circuit 18 via path 15. The output from power amplifier 14 includes a distortion component caused by the amplifying step. A small portion of the output signal from power amplifier 14 is obtained from directional coupler 16 and sent to cancellation circuit 18. The gain, phase and delay of the input signal via lead 15 is adjusted so that the input signal is canceled when combined with the output signal from power amplifier 14 in cancellation circuit 18 to derive a pure distortion component on lead 19. When this distortion component on lead 19, after being adjusted for gain and phase, is combined with the signal from the power amplifier output received via path 17 at directional coupler 10, a clean signal is delivered at the output from directional coupler 10 because the distortion component is canceled. A problem with this method, however, is that the amount of cancellation depends on the precision of the gain and phase adjustments.

Figure 2:
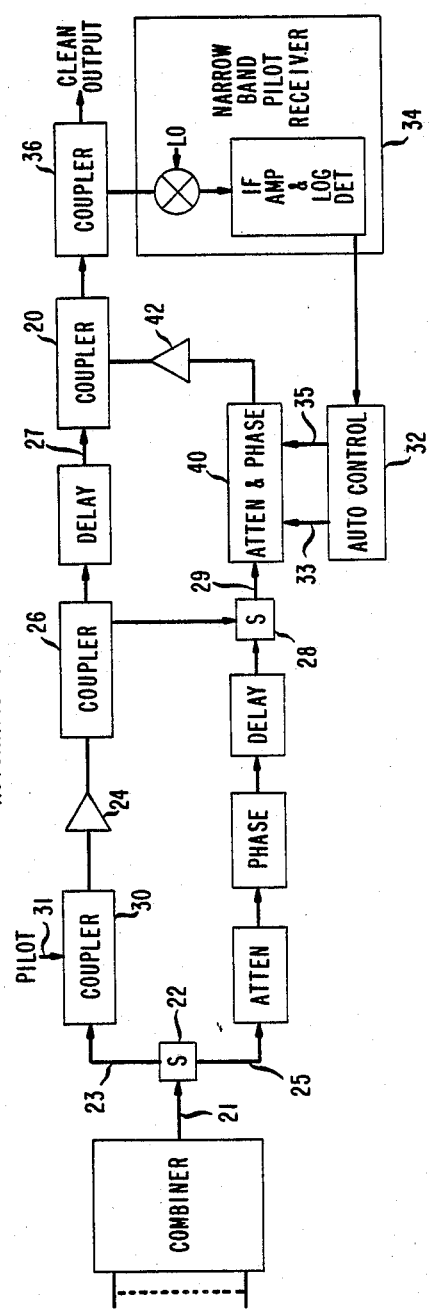
FIG. 2 shows the circuit in block diagram useful to effect the present invention.

Referring to FIG. 2, there is shown in block diagram form the preferred embodiment of the present invention. A test signal, or pilot signal, is inserted into the path of the input signal via coupler 30 where they are mixed before delivery to the input of power amplifier 24. The level, that is amplitude, of the pilot signal is adjusted to be equal to the level of the distortion components being generated in power amplifier 24. This is typically about thirty decibels below the desired signal level. The amplitude and delay of the clean input signal via path 25 are adjusted to equal the amplitude and delay of the distortion output sample; the phase, however, is adjusted to be exactly opposite. The input signal via path 25 and the input signal component from coupler 26 cancel each other at summing pad 28 leaving the distortion present on output lead 29 from summing pad 28. The gain, phase and delay adjustments at this point are not critical because the adjustments are necessary only to reduce the clean signal down to the level of the distortion to obtain good results.

The distortion components, however, require precise adjustment of gain and phase to produce maximum cancellation of distortion when added back into the delayed output. This adjustment is made by the automatic control circuit 32. The reference for control circuit 32 is the pilot signal which is detected using narrow band receiver 34. Samples of the output from coupler 20, which represents the point where distortion is being canceled, are obtained from coupler 36 and delivered to narrow band receiver 34. The amplitude of the pilot is detected and used by control circuit 32 to determine the precise gain and phase adjustments for circuit 40 which are necessary to produce the best cancellation of both the pilot and the distortion introduced by power amplifier 24.

Figure 3:
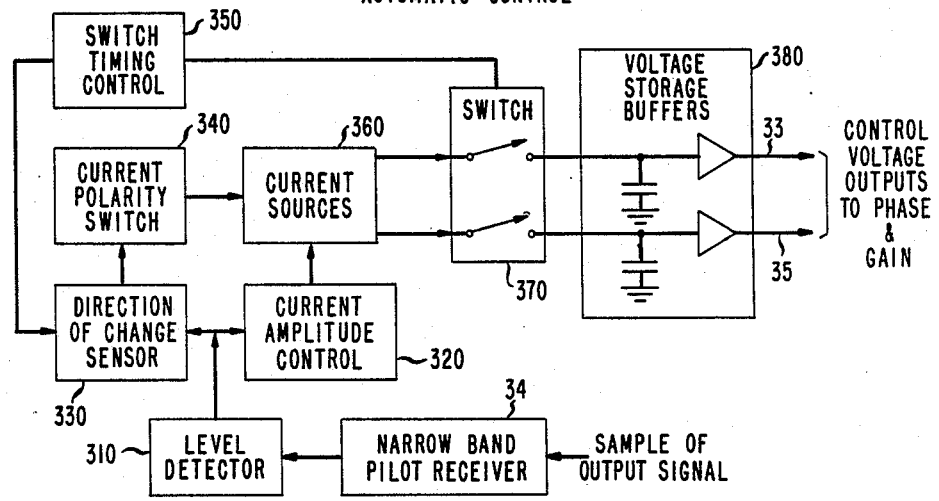

Referring to FIG. 3, there is shown a block diagram of control circuit 32 in FIG. 2. The output from level detector 310 is proportional to the logarithm (log) of the pilot amplitude. Under control of switch timing control circuit 350, switch 370 causes current sources in circuit 360 to be connected to voltage storage buffers 380. The output signals from buffer 380 via leads 33 and 35, respectively, control the gain and phase adjustments of circuit 40 for substantially eliminating the distortion components.

Each time switch 370 is closed, a small adjustment is made to circuit 40. The direction of the change is detected by sensor 330 which controls the polarity of the current sources in circuit 360. If the pilot amplitude is reduced by the adjustment, the polarity remains the same for the next adjustment. If the pilot amplitude is increased by the adjustment, the polarity of the current source is reversed for the next adjustment. This process reduces the pilot amplitude to a minimum. The size of each change is controlled by the amount of current being delivered to voltage storage buffers 380. This current is made proportional to the amplitude of the pilot so that as the ideal settings are approached the adjustments become finer.

Referring to FIG. 4, there is shown further detail for the entire electronic gain and phase controller comprising: narrow band pilot receiver and level detector 34 of FIG. 2; automatic control circuit 32 of FIG. 2; attenuator and phase circuit 40 which comprises ninety degree splitter 410, two biphase attenuators 420 and 430, and summing pad 440; and, amplifier 42. Such an arrangement allows 360 degrees of phase adjustment and about twenty decibels of gain change.

Figure 5:
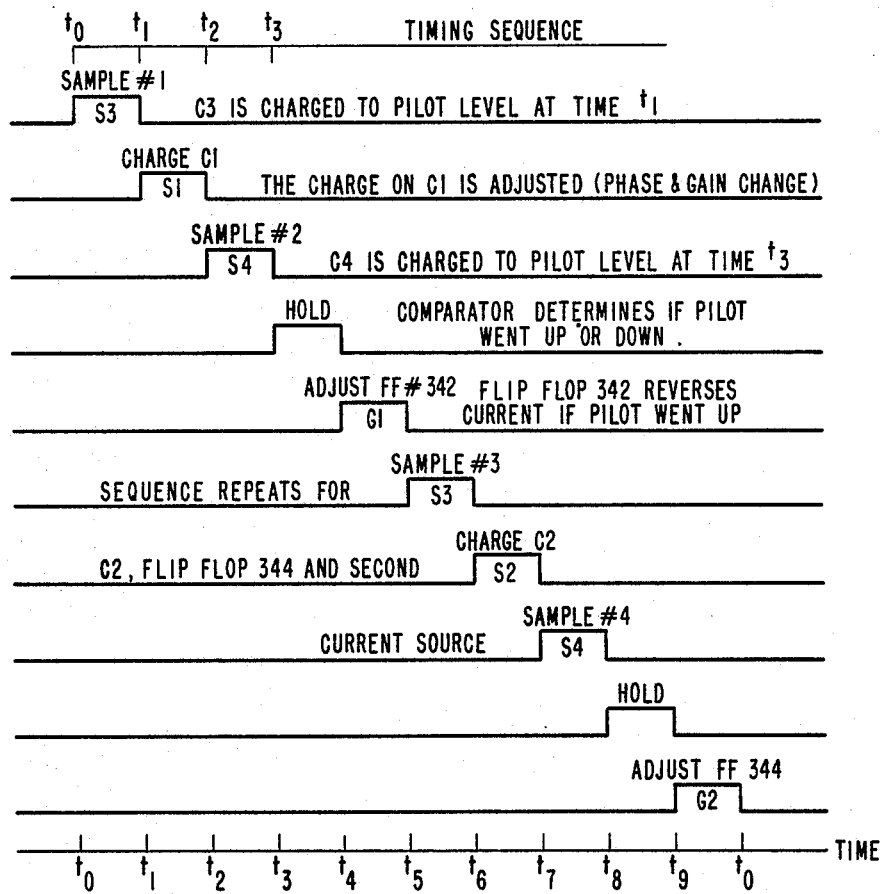
FIG. 5 is a timing diagram for the control circuit.

Switch timing control circuit 350 of FIG. 3 comprises decade sequencer 352 as shown in FIG. 4. This sequencer 352 controls four switches: switch 370 which comprises switches $S_1$ and $S_2$; and, switches $S_3$ and $S_4$ which are part of direction of change sensor 330. Sequencer 352 also controls two gates $G_1$ and $G_2$. FIG. 5 is a timing diagram showing the sequence in which these switches and gates are controlled.

At time $t_0$ when $S_3$ is closed, capacitor $C_3$ begins charging to the pilot level. At time $t_1$, $S_3$ opens, $S_1$ is closed, capacitor $C_1$ begins charging, and the phase and gain changes of the distortion signal are effected via the biphase attenuator 430 in circuit 40. Then at time $t_2$, switch $S_1$ opens, switch $S_4$ is closed, and capacitor $C_4$ begins charging to the pilot level. At time $t_3$, switch $S_4$ opens, and comparator 332 determines whether the pilot level changed up or down. At time $t_4$, gate $G_1$ is enabled, flip flop 342 is toggled, that is, the current is reversed if the output from comparator 332 indicates the pilot level has increased. At time $t_5$, the enabling signal to gate $G_1$ is removed.

The aforesaid steps are repeated at times $t_5$ through $t_9$, for operating switches $S_3$, $S_4$, $S_2$, gate $G_2$, flip flop 344, for charging and discharging capacitors $C_3$, $C_4$, and $C_2$ and for adjusting biphase attenuator 420. Thereafter at time $t_0$, the enabling signal to gate $G_2$ is removed and the entire sequence recycled repeatedly. As the ideal settings of gain and phase are approached, the size of each adjustment becomes smaller.

Figure 6:
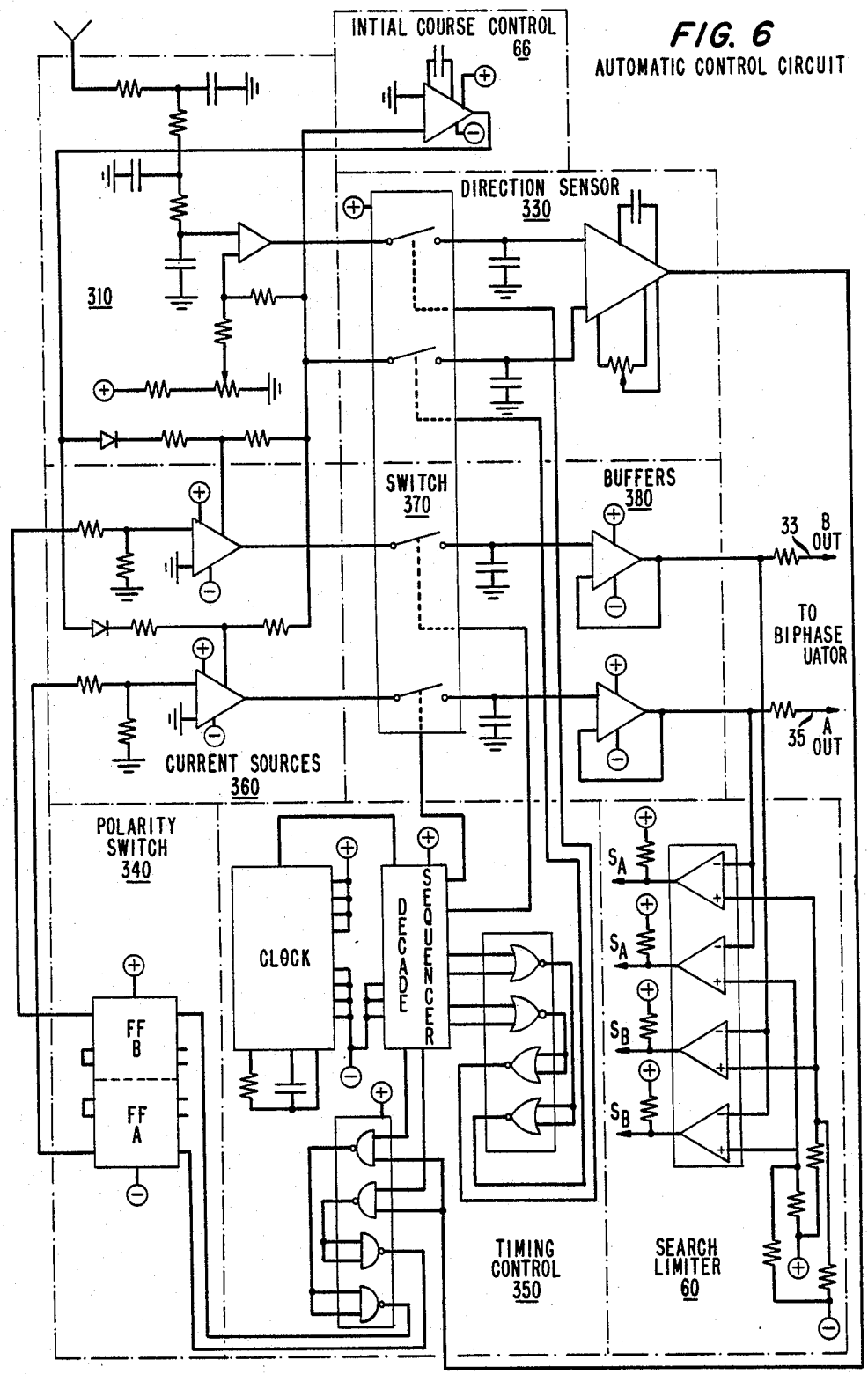

FIG. 6 shows greater detail than FIG. 4 for control circuit 32 of FIG. 2. The operation of each the components is known to one skilled in the art and is not repeated here. Two refinements, however, have been included in FIG. 6. One is a search limiter 60 which prevents a lock up condition from occurring if the pilot is temporarily lost. The search limiter contains four comparators which sense the positive and negative voltage levels at the buffer outputs 33, 35. When these voltages approach their limit the comparators reverse the current sources. This prevents the voltage output from limiting and locking. The other refinement is the addition of a course control circuit 66, or large step size search circuit, for faster initial adjustments, when the circuit is turned on.

What is claimed is:

1. An automatic control system for reducing the distortion produced by a power amplifier said control system comprising
    means for inserting a pilot signal into the path of an input signal before delivery to said power amplifier,
    means for extracting a sample of the output signal from said power amplifier,
    means for delivering a signal representing the amplitude of said pilot signal present in said output signal from said extracted sample, and
    means responsive to said signal representing the amplitude of said pilot signal present in said output signal for automatically controlling the attenuation and phase of a distortion component which is derived from said output signal so that when said controlled distortion component is coupled with said output signal, substantially all distortion, including said pilot signal, is canceled leaving a substantially pure amplified signal.

2. The automatic control system of claim 1 wherein said means responsive to said signal representing the amplitude of said pilot signal present in said output signal for automatically controlling the attenuation and phase of the distortion component comprises
    means for comparing said amplitude of said pilot signal in two successive time intervals to determine whether said amplitude has changed and for producing a signal representative of said change, and
    means responsive to said signal representative of said change for adjusting said attenuation and said phase of said distortion component.

3. The automatic control system of claim 2 further comprising means for preventing said system from malfunctioning when said pilot signal is lost temporarily.

4. The automatic control system of claim 2 wherein said means responsive to said signal representing the amplitude of said pilot signal present in said output signal further for automatically controlling the attenuation and phase of the distortion component comprises means for controlling the step size of said signal representative of said change when said automatic control system is first turned on.

5. A method for automatically controlling the distortion produced by a power amplifier comprising the steps of
    inserting a pilot signal into the input signal before delivery to said power amplifier,
    extracting a sample of the output signal from said power amplifier,
    delivering a signal representing the amplitude of said pilot signal present in said output signal from said extracted sample, and in response to said signal representing the amplitude said pilot signal present in said output signal
    automatically controlling the attenuation and phase of the distortion component which is derived from said output signal so that when said controlled distortion component is coupled with said output signal, substantially all distortion, including said pilot signal, is canceled leaving a substantially pure amplified signal.

6. The method of claim 5 wherein step for automatically controlling the attenuation and phase of the distortion component in response to said signal representing the amplitude of said pilot signal comprises the steps of
- comparing said amplitude of said pilot signal in two successive time intervals to determine whether said amplitude has changed and for producing a signal representative of said change, and
- adjusting said attenuation and said phase of said distortion component in response to said signal representative of said change.

7. The method of claim 6 further comprising the step of preventing the amplifier system from malfunctioning when said pilot signal is lost temporarily.

8. The method of claim 6 wherein said step of automatically controlling the attenuation and phase of the distortion component further comprises the step of controlling the step size of said signal representative of said change when said automatic control system is first turned on.

* * * * *